United States Patent [19]

Miyashita

[11] Patent Number: 5,550,511
[45] Date of Patent: Aug. 27, 1996

[54] DIFFERENTIAL AMPLIFIER HAVING SINGLE PHASE INPUT AND TWO OUTPUT PHASES

[75] Inventor: Miyo Miyashita, Hyogo, Japan

[73] Assignee: Mitsubishi Denki Kabushiki Kaisha, Tokyo, Japan

[21] Appl. No.: 451,493

[22] Filed: May 26, 1995

[30] Foreign Application Priority Data

Jun. 2, 1994 [JP] Japan .................................. 6-121197

[51] Int. Cl.$^6$ .................................................. H03F 3/45
[52] U.S. Cl. ............................ 330/253; 330/261; 330/301
[58] Field of Search ............................. 330/252, 253, 330/261, 301; 327/563

[56] References Cited

U.S. PATENT DOCUMENTS

| | | | |
|---|---|---|---|
| 4,968,904 | 11/1990 | Yamashita et al. | 307/475 |
| 5,068,621 | 11/1991 | Hayward et al. | 330/253 |
| 5,473,529 | 12/1995 | Böhme | 330/301 X |

FOREIGN PATENT DOCUMENTS

| | | |
|---|---|---|
| 0354557 | 2/1990 | European Pat. Off. . |
| 63-232711 | 9/1988 | Japan . |
| 4056507 | 2/1992 | Japan . |
| 2247795 | 3/1992 | United Kingdom . |

Primary Examiner—Steven J. Mottola
Attorney, Agent, or Firm—Leydig, Voit & Mayer

[57] ABSTRACT

A differential amplifier includes switching FETs provided at an input side and at a reference side, respectively, forming a differential pair; an FET serving as a constant current source for providing a current flow equal to a sum of the currents flowing through the respective switching FETS; and an inductor connected in series to the FET serving as a constant current source between the connection node of both switching FETs and the power supply of the amplifier. The inductor is not a load with respect to DC and any fluctuation of the signal current flowing through the FET serving as a constant current source is small so that any difference between the output voltages at two different phase outputs is reduced.

8 Claims, 13 Drawing Sheets

DIFFERENTIAL AMPLIFIER HAVING SINGLE PHASE INPUT AND TWO OUTPUT PHASES

FIELD OF THE INVENTION

The present invention relates to a differential amplifier and, more particularly, to a differential amplifier that outputs two phase signals having equal amplitudes in response to a single phase input signal.

BACKGROUND OF THE INVENTION

FIG. 13 is a diagram illustrating a prior art differential amplifier having a single phase input and two phase output. In the figure, reference numeral 1 designates a field effect transistor (hereinafter referred to as FET) Q1 having its gate as an input terminal. Reference character IN designates an input terminal to which a signal to be amplified is input, and this input terminal is connected to a gate of the FET Q1. Reference numeral 2 designates an FET Q2 whose gate terminal is connected to a minus side terminal of the reference voltage source $V_{REF}$ and a source terminal thereof is commonly connected to the source terminal of the FET Q1. A load resistance R1 is connected to a drain terminal of the FET Q1. A load resistance R2 is connected to a drain terminal of the FET Q2. An anode electrode of a level shift diode D1 is connected to the ground and a cathode electrode of the level shift diode D1 is connected to the other ends of the load resistances R1 and R2. A constant current source FET Q3 has its gate terminal and source terminal both connected to the power supply $V_{SS}$ and a drain terminal connected to the connection node of the source electrodes of the FET Q1 and FET Q2. Reference character $V_{REF}$ designates a reference voltage source whose plus side terminal is connected to the ground and the minus side terminal of the reference voltage source $V_{REF}$ is connected to the gate terminal of the FET Q2. Reference character OUT designates an output terminal connected to the drain terminal of the FET Q2. Reference character $\overline{OUT}$ designates an output terminal connected to the drain terminal of the FET Q1. An amplified signal of the same phase as that of the signal input to the input terminal IN is output from the output terminal OUT and an amplified signal of the reverse phase to that of the signal input to the input terminal IN is output from the output terminal $\overline{OUT}$. A differential amplifier is constructed by the above described circuit elements FET Q1, FET Q2, R1, R2, D1 and FET Q3.

FIGS. 14(a)–14(d) show timing waveforms of the voltage applied to respective terminals and the current flowing through respective FETs in the prior art differential amplifier shown in FIG. 13.

FIG. 14(a) is a diagram for explaining the circuit parameters of the prior art differential amplifier shown in FIG. 13 which are established so as to obtain the timing waveforms of FIGS. 14(b)–14(d).

In the graph shown in FIG. 14(b), the broken line shows the input voltage $V_{IN}$ input to the input terminal IN, the dotted line shows the value of the power supply $V_{REF}$, and a solid line shows the drain terminal voltage $V_{D3}$ of the FET Q3.

The input signal is −3.6±0.5 V, the reference voltage source $V_{REF}$ is −3.6 V, the power supply $V_{SS}$ is −5.2 V, and the period is 500 ps(=0.5 ns).

The second stage graph shown in FIG. 14(c) shows the two phase output waveforms, and the broken line shows the voltage waveform $V_{\overline{OUT}}$ of the reverse phase output $\overline{OUT}$, and the solid line shows the waveform $V_{OUT}$ of the positive phase output OUT.

The bottom graph shown in FIG. 14(d) shows current waveforms of the drain currents I1, I2 and I3 of the respective FETs Q1, Q2 and Q3, and the solid line shows a current waveform of I1, a broken line shows a current waveform of I2, and the dotted line shows a current waveform of I3.

A description is given of the operation. When the input voltage input to the terminal IN is at low level (−3.6− 0.5 V), the gate source terminal voltage $V_{GS1}$ of the FET Q1 becomes $V_{GS1} \div V_{TH}$ (=0.1 V) for the threshold voltage $V_{TH}$ and the FET Q1 is turned off. On the other hand, since the FET Q2 has a gate source terminal voltage of $V_{GS2} \div 1$ V ($\gg V_{TH}$), the FET Q2 is turned on, whereby a current of I2÷I3 (the difference between I2 and I3 in the figure is a gate source current $I_{GS2}$ of the FET Q2) flows therethrough. Next, when the input voltage is at high level (−3.6+0.5 V), $V_{GS1} \div 1$ V and the FET Q1 is turned on, whereby a current of I1÷ I3 (the difference between I1 and I3 in the figure is a gate source current $I_{GS2}$ of the FET Q2) flows therethrough, thereby turning off the FET Q2.

Thus when the FET Q2 is turned off, it should be $V_{GS2}=V_{TH}$. However, since the gate terminal of the FET Q2 is fixed to a constant voltage ($V_{REF}$=−3.6 V), the drain terminal voltage $V_{D3}$ of the FET Q3 serving as a constant current source is raised, thereby turning off the FET Q2.

Accordingly, the drain terminal voltage of the FET Q3 changes with a constant amplitude of $\Delta V_{D3} \div$(input voltage amplitude )/2−$V_{TH}$. The current flowing through the FET Q3 serving as a constant current source changes (by ΔI3) in proportion to the change $\Delta V_{D3}$ of the drain terminal voltage. Since $\Delta V_{D3}=\Delta I3 \times R_{DS3}$ (the impedance between drain and source of the FET Q3), when the $R_{DS3}$ is large, i.e., several tens of kΩ, the change in the current is quite small, i.e., negligible. However, when a conventional GaAs MESFET is employed, the impedance thereof is relatively small, i.e., several hundreds to 1 kΩ, and the change in the current cannot be ignored. In the graphs of FIGS. 14(b) to 14(d), the drain terminal voltage of the FET Q3 changes by $\Delta V_{D3}=$ about 0.4 V, and, since the impedance $R_{DS3}$ of the FET Q3 is about 2 kΩ, the current changes by about ΔI3÷0.2 mA.

By this influence, a difference of I1−I2=(1.77 mA$_{p-p}$)−(1.64 mA$_{p-p}$)=0.13 mA between the drain current amplitudes of the FET Q1 and the FET Q2 is generated, and a difference is generated in the output voltage amplitude at both of the output terminals OUT and $\overline{OUT}$ by the product of the current amplitude difference and the load resistance R1 or R2, i.e., (I1−I2)·R1=0.13 mA×600Ω=78 mV (this approximately coincides with the difference of 80 mV between $V_{OUT}$=1.05 V$_{p-p}$ and $V_{\overline{OUT}}$=0.97 V$_{p-p}$.)

In the prior art differential amplifier circuit constructed as described above, the operation mechanism of turning on and off the FET Q1 and the FET Q2 is different depending on whether the input signal voltage is high or low. In the FET Q3 having a small drain-source impedance, there is generated a difference between the signal currents I1 and I2 flowing therethrough, thereby producing a difference in the output voltage amplitude.

SUMMARY OF THE INVENTION

It is an object of the present invention to provide a differential amplifier that has a single phase input and two phase output and produces output signals of equal amplitude.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a differential amplifier having a single phase input and two phase output includes switching field effect transistors at the input side and at the reference side, respectively, forming a differential pair, a field effect transistor serving as a constant current source for a current equal to a sum of the currents flowing through the respective switching field effect transistors, and an inductor connected in series to the field effect transistor serving as a constant current source between a connection node of the source electrodes of both switching field effect transistors and the power supply of the circuit. Therefore, the inductor does not become a load with respect to DC, and any fluctuation of the signal current flowing through the FET serving as a constant current source is small, whereby a difference in the output voltages is reduced.

According to a second aspect of the present invention, in the differential amplifier, the connection node of the source electrodes of both switching field effect transistors and a terminal of the field effect transistor serving as a constant current source are connected with each other, the field effect transistor serving as the constant current source has another terminal and its gate electrode connected with each other, and the inductor is connected between the other terminal of the field effect transistor serving as the constant current source and the power supply of the circuit. Therefore, the inductor does not become a load with respect to DC, and any fluctuation of the signal current flowing through the FET serving as a constant current source is small, whereby a difference in the output voltages is reduced.

According to a third aspect of the present invention, in the differential amplifier, one terminal of the field effect transistor serving as a constant current source is connected to the power supply of the circuit, the inductor is connected between another terminal of the field effect transistor serving as a constant current source and the connection node of the source electrodes of both the switching field effect transistors, and the gate electrode of the field effect transistor serving as a constant current source and the terminal of the field effect transistor serving as a constant current source are mutually connected with each other and connected to the power supply of the circuit. Therefore, the inductor does not become a load with respect to DC, and any fluctuation of the current flowing through the FET serving as the constant current source is small, whereby a difference in the output voltages is reduced.

According to a fourth aspect of the present invention, in the differential amplifier, the connection node of the source electrodes of both switching field effect transistors and one terminal of the field effect transistor serving as a constant current source are connected with each other, the inductor is connected between another terminal of the field effect transistor serving as a constant current source and the power supply of the circuit, and the gate electrode of the field effect transistor serving as a constant current source is connected with the terminal of the inductor which is connected with the power supply of the circuit. Therefore, the inductance of the inductor which performs the above-described function can be small.

According to a fifth aspect of the present invention, a differential amplifier having a single phase input and two phase output includes switching field effect transistors at the input side and at the reference side, respectively, forming a differential pair, a field effect transistor serving as a constant current source for a flow current equal to a sum of the currents flowing through the respective switching field effect transistors, the respective loads of the switching field effect transistors at the input side and at the reference side being set so that the load is smaller at the input side than at the reference side and the products of the load and the currents flowing through the respective loads are equal to each other at both transistors. Therefore, the output voltages can be made equal to each other.

According to a sixth aspect of the present invention, in a differential amplifier, the loads of the switching field effect transistors at the input side and at the reference side comprise resistors having different resistance values at the input side and at the reference side, respectively. Therefore, the output voltages can be made equal to each other.

According to a seventh aspect of the present invention, in the differential amplifier the load of the switching field effect transistor at the input side comprises a parallel circuit comprising a resistor having a predetermined resistance and a serial circuit for adjusting the resistance of the load, the serial circuit comprising a capacitance and a resistance, and the load of the reference side switching field effect transistor comprises a resistor having a predetermined resistance. Therefore, the respective loads of the respective switching FETs can be made equal with respect to DC and can be changed for AC signals, whereby the output voltages can be made equal to each other.

According to an eighth aspect of the present invention, in the differential amplifier the load of the switching field effect transistor at the input side comprises a resistor having a predetermined resistance, and the load of the switching field effect transistor at the reference side comprises a serial circuit comprising a resistor having the predetermined resistance and an inductor for adjusting the resistance of the load. Therefore, the respective loads of the respective switching FETS can be made equal for DC, and can be changed for AC signals, whereby the output voltages can be made equal to each other.

DETAILED DESCRIPTION OF THE PREFERRED EMBODIMENTS

Embodiment 1

Figure 1:
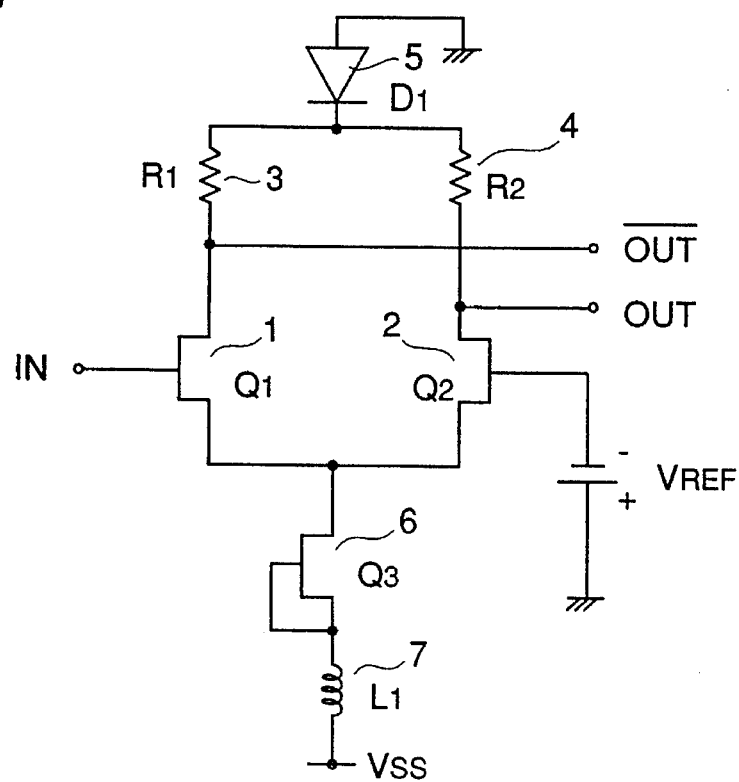
FIG. 1 is a circuit diagram illustrating a differential amplifier having a single phase input and two phase output according to a first embodiment of the present invention.
Figure 13:
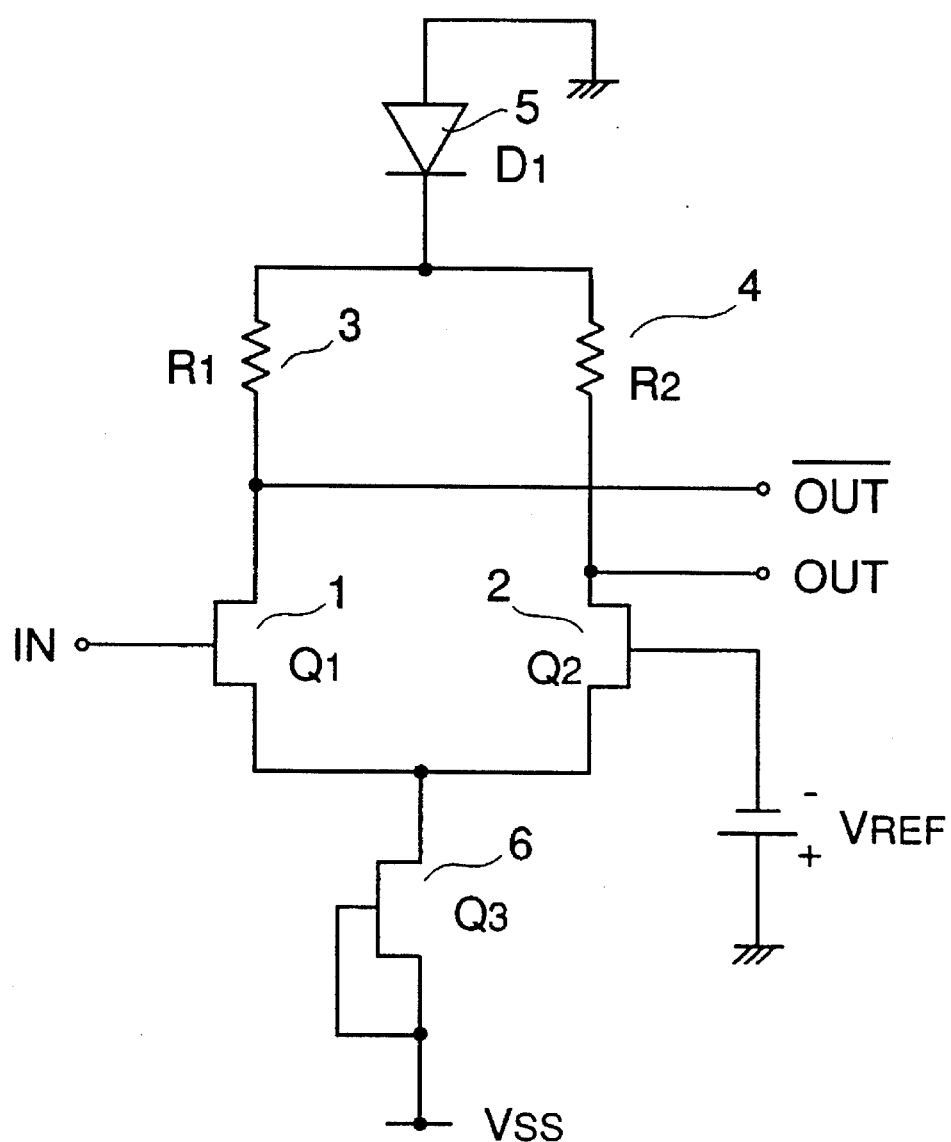
FIG. 13 is a circuit diagram illustrating a prior art differential amplifier having a single phase input and two phase output.

FIG. 1 is a circuit diagram illustrating a construction of a differential amplifier according to a first embodiment of the present invention. In the figure, the same reference numerals as those in FIG. 13 designate the same or corresponding elements. Reference numeral 7 designates an inductor L1 connected from the connection node of the gate terminal and the source terminal of the FET Q3 serving as a constant current source to the power supply $V_{ss}$.

A description is given of the operation. Since in this embodiment the inductor L1 is connected in series with the FET Q3, the impedance of the whole constant current source is represented by the following formula.

Constant current source impedance=$R_{DS3}+Z_L=R_{DS3}+2\pi fL=R_{DS3}+2\pi L/T$ Here, $Z_L$: impedance of inductor L1, L: inductance, f: frequency of input signal, T: period of input signal.

When the input signal has a frequency above a prescribed frequency, the L takes quite a large value, whereby the impedance of the constant current source is increased. Also, because $Z_L=0(T\to\infty)$ at DC and the effect of the inductor is negligible, the bias voltages in the respective elements are the same as those in the prior art example shown in FIG. 13.

Figure 3:
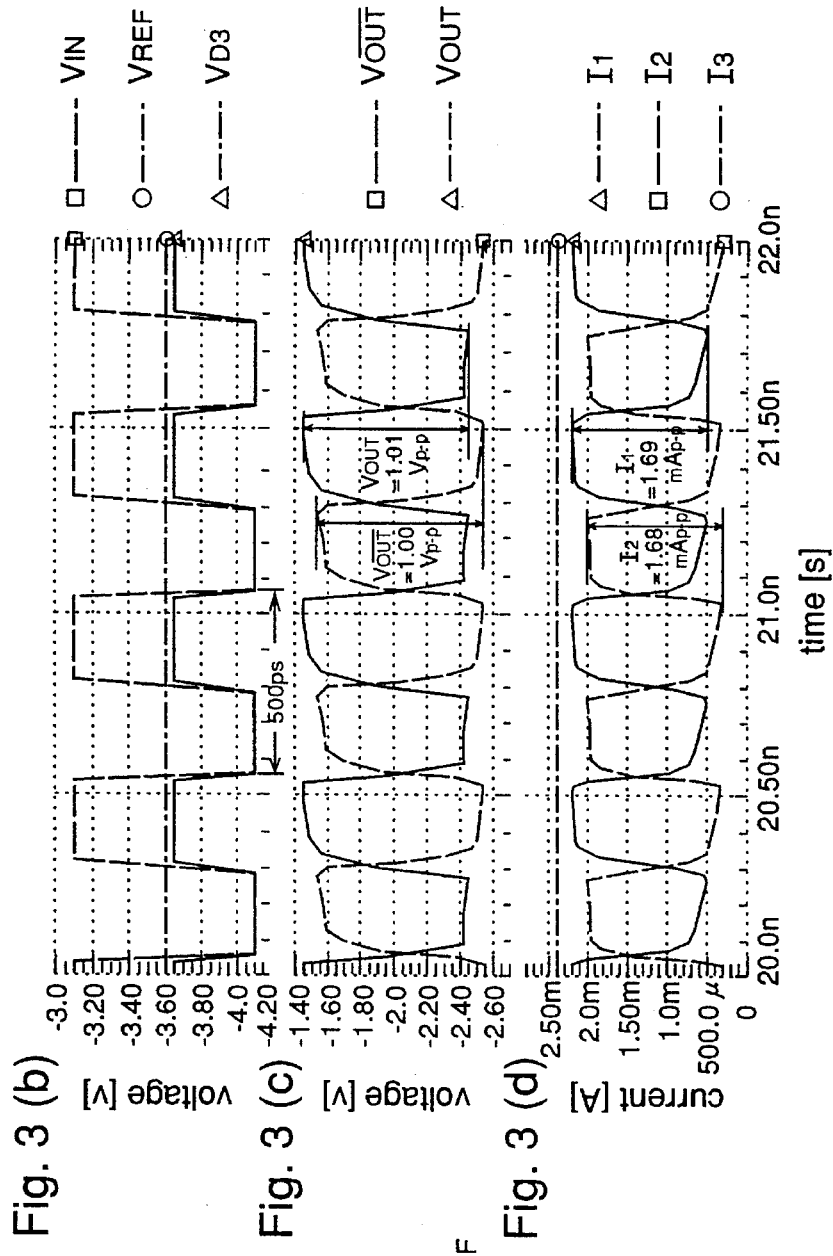
FIGS. 3(a), 3(b), 3(c) and 3(d) are diagrams illustrating a voltage waveform and a current waveform at the respective terminals in a differential amplifier having a single phase input and two phase output according to the first embodiment shown in FIG. 1.
Figure 14:
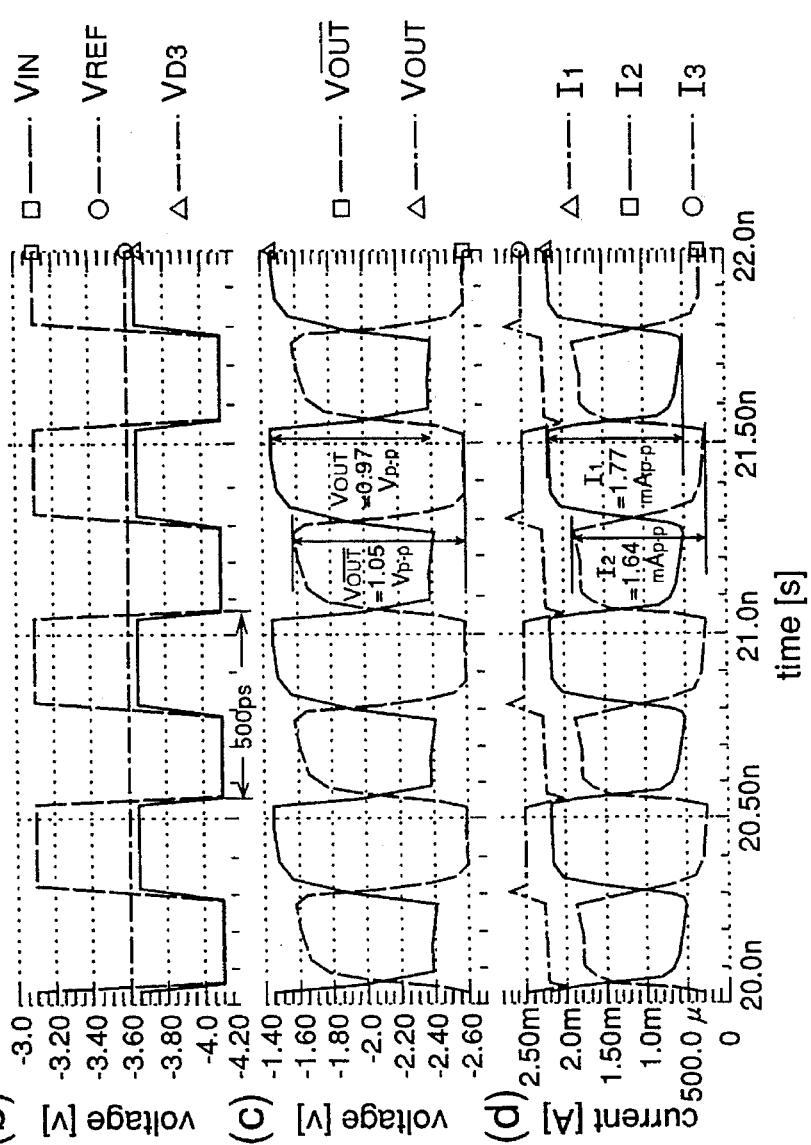
FIGS. 14(a), 14(b), 14(c) and 14(d) are diagrams illustrating a prior art voltage waveform and a current waveform at the respective terminals in a differential amplifier having a single phase input and two phase output shown in FIG. 13.

FIGS. 3(b)–3(d) show the timing waveforms for the voltages at the respective terminals and for the currents flowing through the respective FETs in the differential amplifier shown in FIG. 1 which is also illustrated in FIG. 3(a) with parameters of respective elements. Reference characters and various lines in the respective graphs, the values of the input voltage and respective voltage sources, and the input signal period are the same as those in FIGS. 14(b) to 14(d).

In FIGS. 3(b)–3(d), assuming that the inductance of the inductor L1 is 1.5 μH, the impedance $Z_L$ becomes about 18.8 kΩ for the input signal having a period T of 500 ps, and the impedance of the entirety of the constant current source becomes about 20 kΩ. Even when the drain voltage $V_{DS}$ of the FET Q3 varies by 0.4 $V_{p-p}$ as shown in FIG. 3(b), the current ΔI3 (=$\Delta V_{DS}$/constant current source impedance) is 20 μA which is reduced to one tenth of the prior art device, and the current I3 takes an approximately constant value. Accordingly, the current amplitude becomes I1÷I2, and at the output terminals OUT and $\overline{OUT}$, $V_{OUT} \doteq V_{\overline{OUT}} \doteq 1$ V, meaning that an approximately equal signal amplitude can be obtained.

As described above, in this first embodiment, respective source terminals of the switching FETs Q1 and Q2 and the drain terminal of the FET Q3 serving as a constant current source are connected with each other, and an inductor is inserted between the connection node at which the gate terminal and the source terminal of the FET Q3 serving as a constant current source are connected and the power supply of the circuit, whereby equal output voltage amplitudes are obtained at both the output terminals.

Embodiment 2

While in the above described first embodiment the inductor is connected in series to the source terminal of the FET Q3 serving as a constant current source, even when the inductor is connected between the drain terminal and the source terminals of the switching FETs Q1 and Q2, the same effect as in the first embodiment will be obtained.

Figure 2:
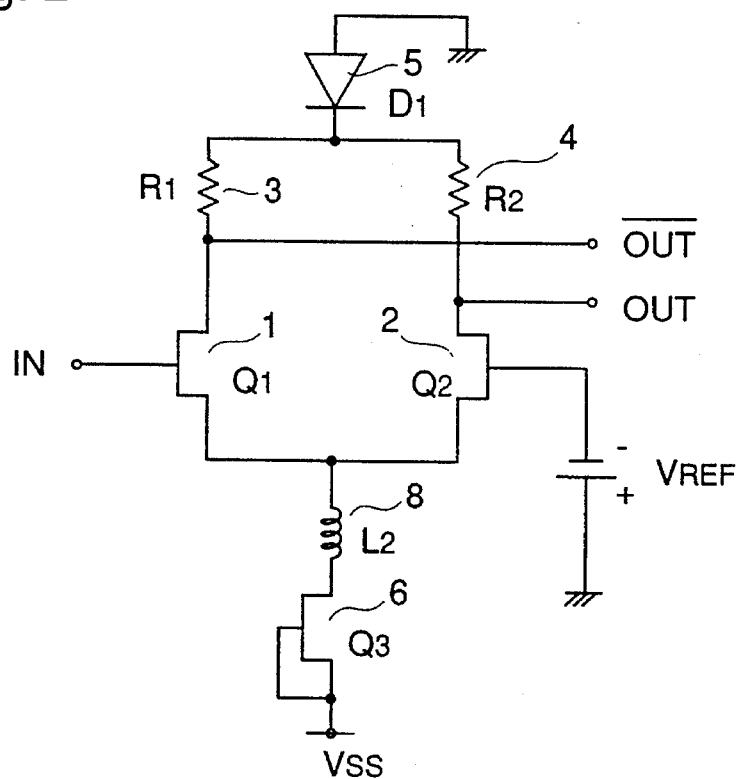
FIG. 2 is a circuit diagram illustrating a differential amplifier having a single phase input and two phase output according to a second embodiment of the present invention.

FIG. 2 shows a circuit diagram of a differential amplifier according to a second embodiment of the present invention. In the figure, the same reference numerals as those in FIG. 13 designate the same or corresponding elements. Reference numeral 8 designates an inductor L2 connected between the connection node of the source terminals of the switching FETs Q1 and Q2 and the drain terminal of the FET Q3 serving as a constant current source.

Figure 4:
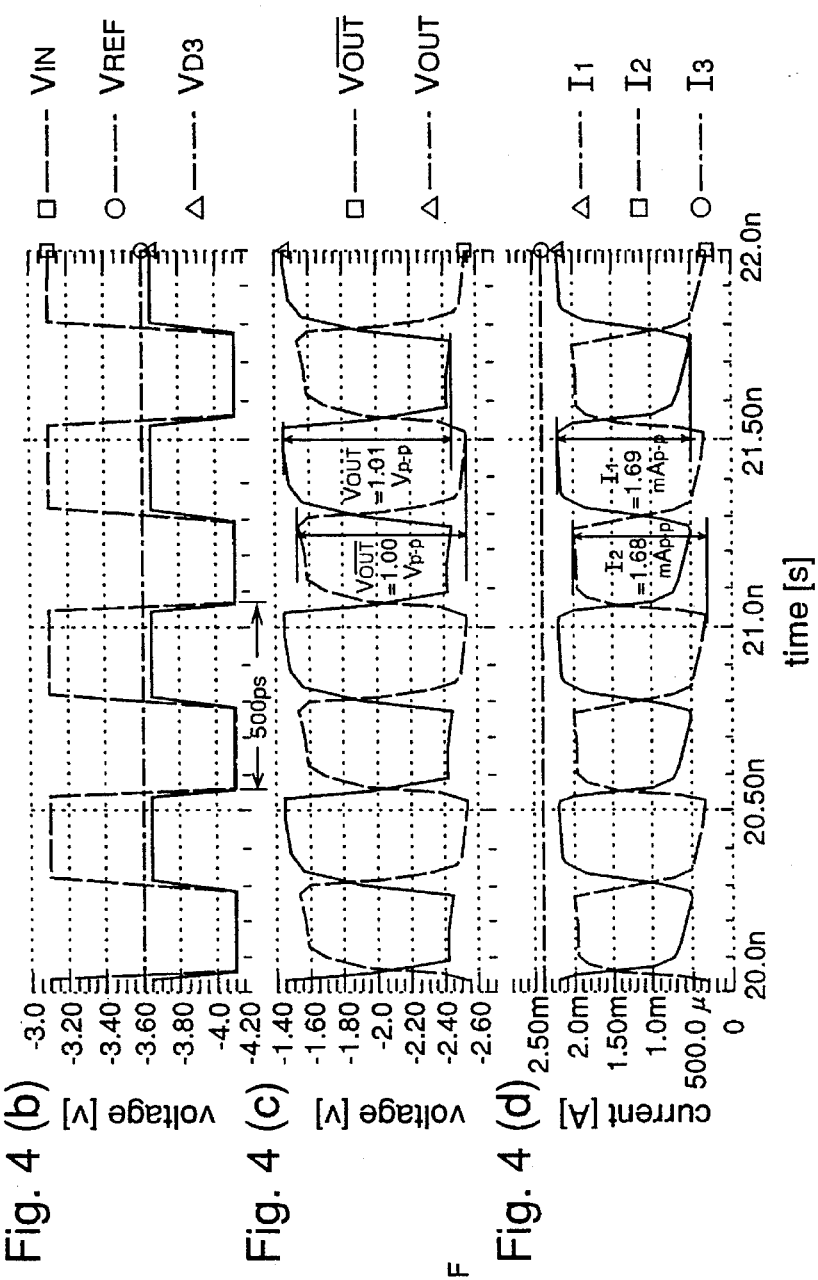
FIGS. 4(a), 4(b), 4(c) and 4(d) are diagrams illustrating a voltage waveform and a current waveform at the respective terminals in a differential amplifier having a single phase input and two phase output according to a second embodiment shown in FIG. 2.

FIGS. 4(b)–4(d) show the timing waveforms for the voltages at the respective terminals and the currents flowing through respective FETs in the differential amplifier shown in FIG. 2 which is also illustrated in FIG. 4(a) with parameters of respective elements. Reference characters and various lines in the respective graphs, the values of the input voltage and the respective voltage sources, and the input signal period are the same as those in FIGS. 14(b) to 14(d).

In FIGS. 4(b)–4(d), the current I3 becomes approximately constant, and equal output voltage amplitudes ($V_{OUT} \doteq V_{\overline{OUT}}$) can be obtained as in the first embodiment.

As described above, in this second embodiment, the source terminal of the FET Q3 serving as a constant current source is connected to the power supply of the circuit, and the inductor L2 is inserted between the drain terminal of the FET Q3 serving as a constant current source and the connection node of the respective source terminals of the switching FETs Q1 and Q2, and the gate terminal of the FET Q3 serving as a constant current source is connected to the power supply of the circuit, whereby the equal output voltage amplitudes can be obtained as in the first embodiment.

Embodiment 3

Figure 5:
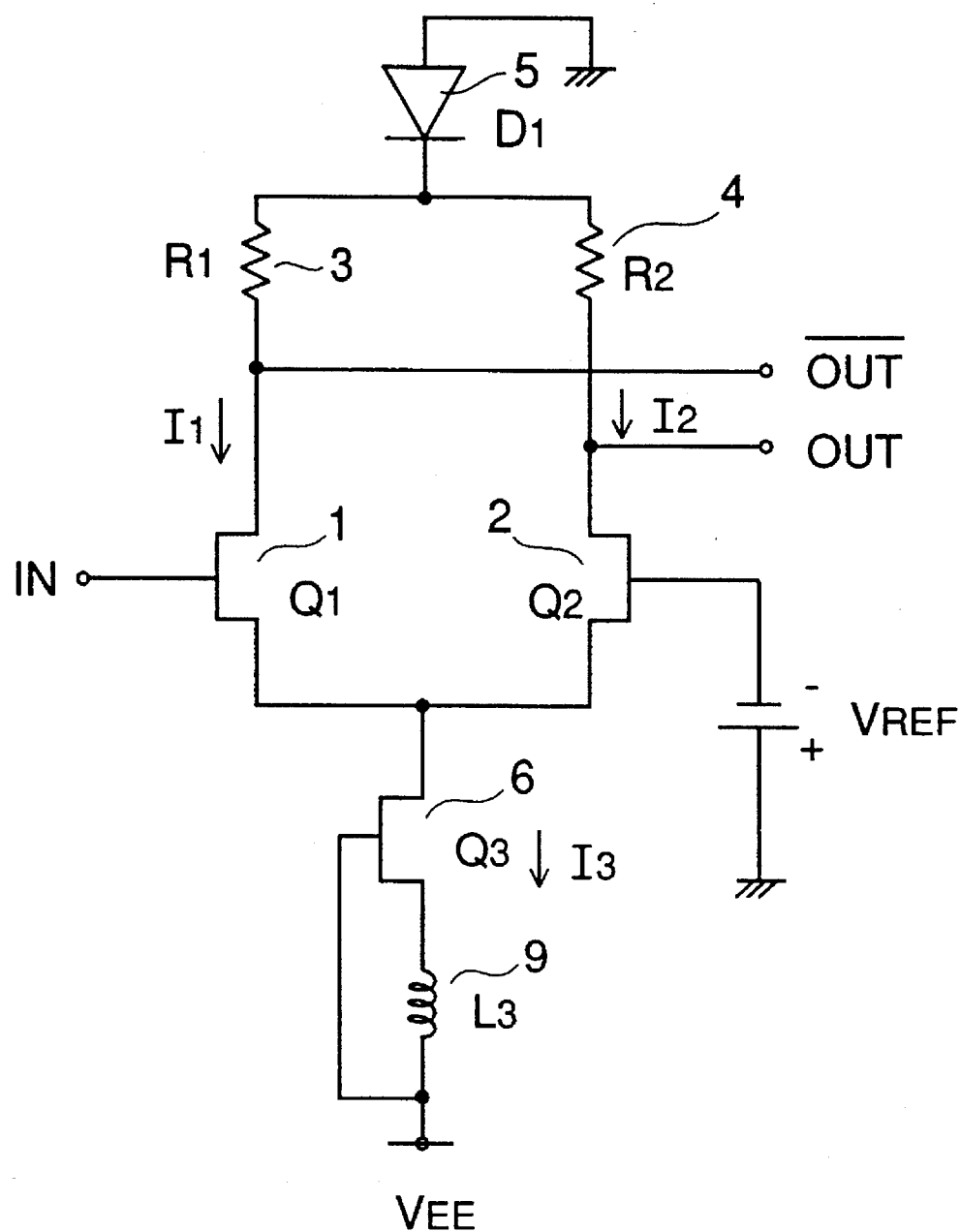
FIG. 5 is a circuit diagram illustrating a differential amplifier having a single phase input and two phase output according to a third embodiment of the present invention.

FIG. 5 is a circuit diagram showing a third embodiment of the present invention. In the figure, the same reference numerals as those in FIG. 13 designate the same or corresponding elements. Reference numeral 9 designates the inductor L3 one end of which is connected to the source terminal of the FET Q3 serving as a constant current source, and the other end of which is connected to the gate terminal of the FET Q3 serving as a constant current source and the voltage source $V_{SS}$.

Next, a description is given of the operation. In this embodiment 3, since the inductor L3 is connected to the FET Q3 serving as a constant current source, when the impedance of the whole constant current source is to rise at above a certain frequency and the current I3 is to increase by $\Delta I3$, the voltage $V_{SS}$ of the source terminal in the FET Q3 serving as a constant current source rises by $\Delta I3 \cdot Z_L$, whereby the gate source voltage $V_{GS3}$ falls, thereby reducing the current flowing through the FET Q3 serving as a constant current source.

Accordingly, in this embodiment 3, the circuit can be constituted by the inductor having a lower inductance than that shown in the first and second embodiments.

Figures 6A, 6B, 6C, 6D:
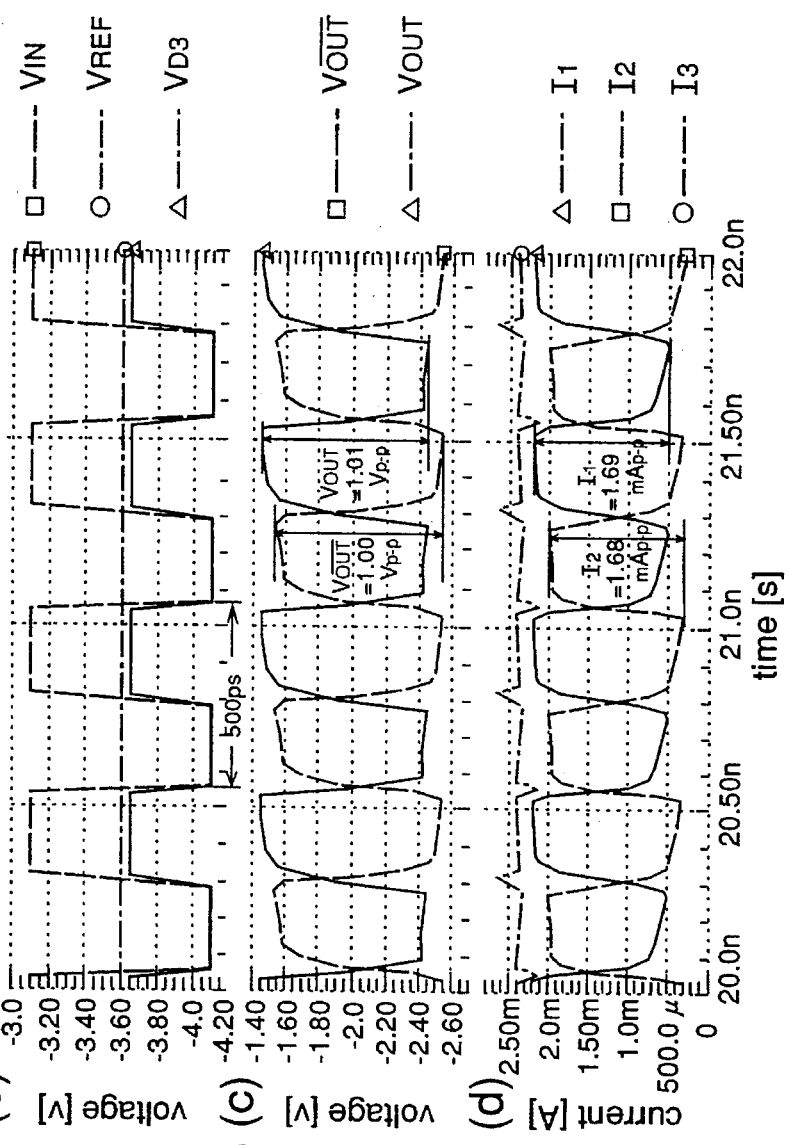
FIGS. 6(a), 6(b), 6(c) and 6(d) are diagrams illustrating a voltage waveform and a current waveform at respective terminals in a differential amplifier having a single phase input and two phase output according to the third embodiment shown in FIG. 5.

FIGS. 6(b)–6(d) show the timing waveforms for the voltages at the respective terminals and the currents flowing in the respective FETs in the differential amplifier shown in FIG. 5 which is also illustrated in FIG. 6(a) with parameters of respective elements. Reference characters and the various lines in the respective graphs, the values of the input voltage and the respective voltage sources, and the input signal period are the same as those in FIG. 14(b) to 14(d). In the figure, the value of the inductor L3 is 0.05 μm, that is, 1/30 of that of the inductor L1, L2 shown in embodiments 1 and 2. The current I3 takes approximately a constant value. The amplitude of the current I1, I2, that is, $I1 \div I2 = 1.68$ mA$_{p-p}$, and the output voltage amplitude of the output terminal OUT and $\overline{OUT}$ are equal to each other, that is, $V_{OUT} \div V_{\overline{OUT}} = 1.0$ V.

As described above, in this embodiment 3, the connection node at the respective source terminals of the switching FETs Q1 and Q2 and the drain terminal of the FET Q3 serving as a constant current source are connected with each other, and the inductor L3 is connected between the source terminal of the FET Q3 serving as a constant current source and the power supply of the circuit, and the gate terminal of the FET Q3 serving as a constant current source is connected to the end of the inductor L3 connected to the power supply of the circuit, whereby the circuit can be constituted by the inductor having a lower inductance than that of the inductor in the embodiments 1 and 2, and the equal output voltage amplitude($V_{out} \div V_{\overline{OUT}}$) can be obtained as in the embodiments 1 and 2.

Embodiment 4

Figure 7:
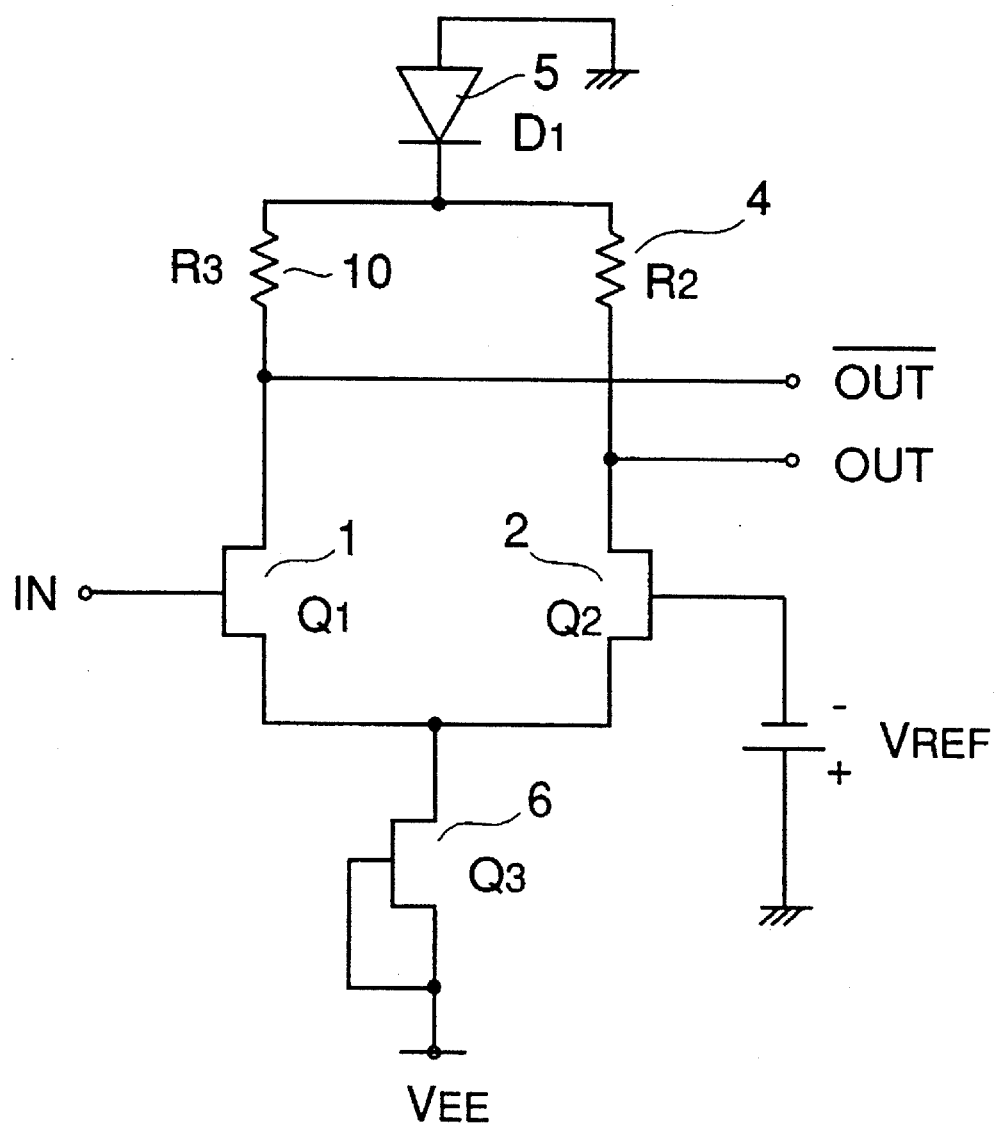
FIG. 7 is a circuit diagram illustrating a differential amplifier having a single phase input and two phase output according to a fourth embodiment of the present invention.

FIG. 7 is a circuit diagram showing a fourth embodiment of the present invention. In the figure, the same reference numerals as those in FIG. 13 designate the same or corresponding elements. Reference numeral 10 designates the load resistance R3 one end of which is connected to the cathode terminal of the diode D1, and the other end of which is connected to the drain terminal of the input side switching FET Q1.

Next, a description is given of the operation. In the differential amplifier in this embodiment 4, in response to the difference of the current amplitude I1 and I2, the respective resistance values of the load of the input side switching FET Q1 and of the reference side switching FET Q2 are changed by the fluctuation of the current $\Delta I3$ of the constant current source, whereby the two phase signal output having equal amplitudes can be obtained.

In FIG. 7, the value of the resistance R3 that the load of the FET Q1 covers is $I1 \cdot R3 = I2 \cdot R2$ (=the output amplitude from the OUT, $\overline{OUT}$ terminal)

Figure 8:
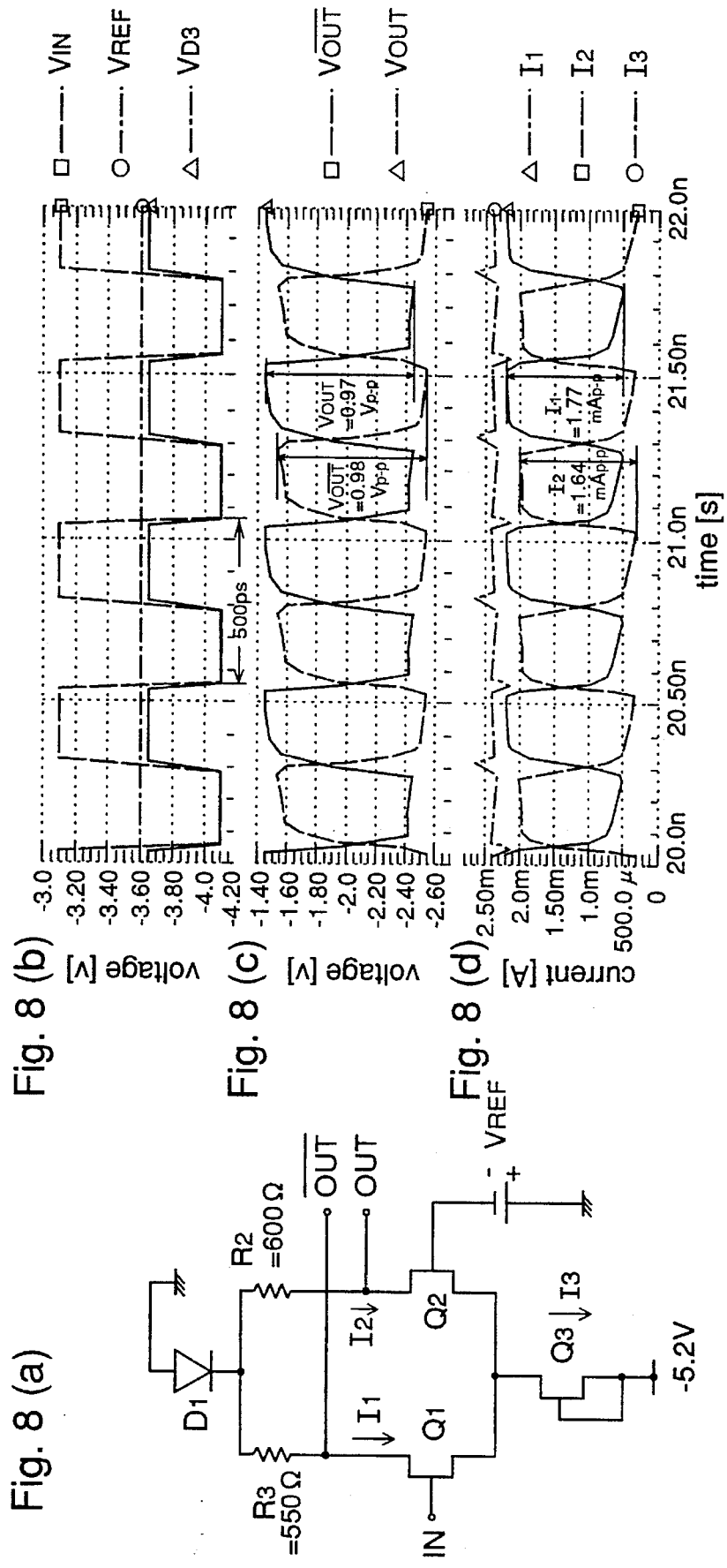
FIGS. 8(a), 8(b), 8(c) and 8(d) are diagrams illustrating a voltage waveform and a current waveform at the respective terminals in a differential amplifier having a single phase input and two phase output according to the fourth embodiment shown in FIG. 7.

FIGS. 8(b)–8(d) show the timing waveforms of the voltages at the respective terminals and the currents flowing through the respective FETs in the differential amplifier shown in FIG. 7 which is also illustrated in FIG. 8(a) with parameters of respective elements. Reference characters and various lines in the respective graphs, the values of the input voltage and the respective voltage sources, and the input signal period are the same as those in FIGS. 14(b) to 14(d). In the figure, when the value of the load R2 is 600 Ω, the current amplitudes of the current I1 and I2 flowing through the switching FETs Q1 and Q2 are 1.77 mA$_{p-p}$ and 1.64 mA$_{p-p}$ respectively, whereby $R3 = I2_{p-p} \cdot R2/I1_{p-p} \div 550$ Ω. As a result, both phase output voltage amplitudes are approximately equal to each other, i.e., $V_{OUT} = 0.97$ V$_{p-p}$, $V_{\overline{OUT}} = 0.98$ V$_{p-p}$.

As described above, in this embodiment 4, an equal output voltage amplitude can be obtained by changing the resistance values of the loads R1 and R2 for the switching FETs Q1 and Q2.

Embodiment 5

Figure 9:
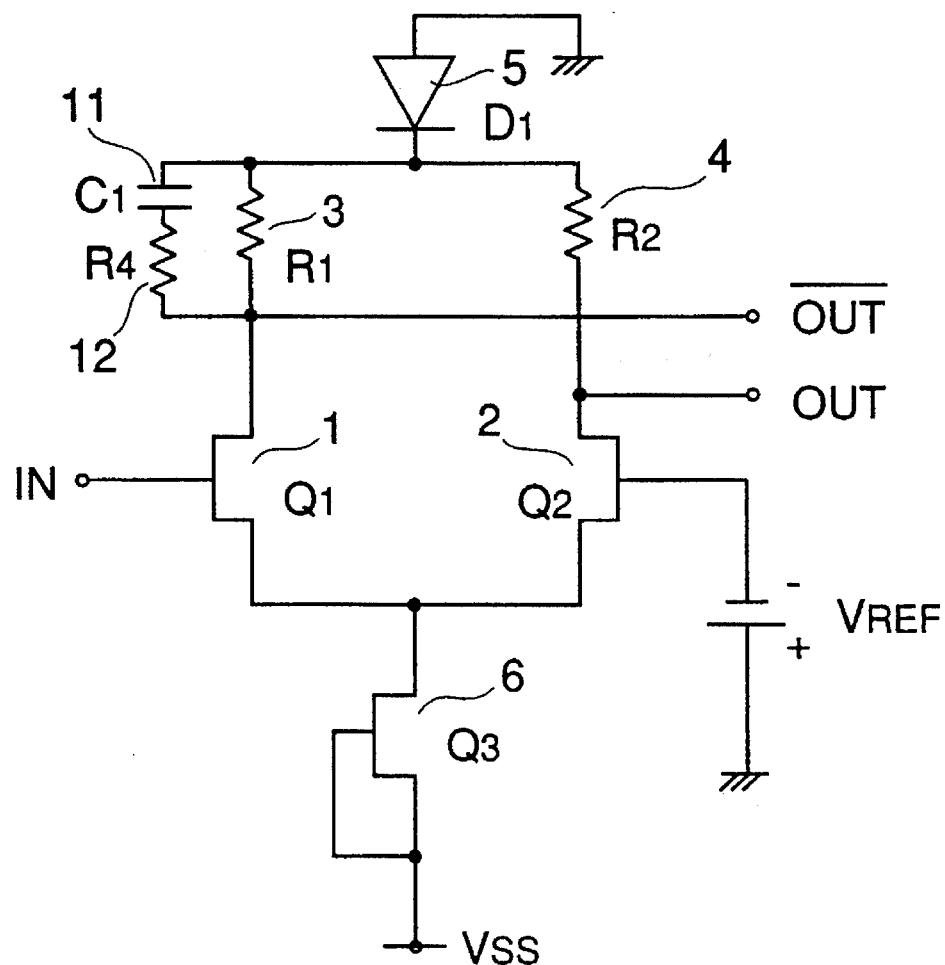
FIG. 9 is a circuit diagram illustrating a differential amplifier having a single phase input and two phase output according to a fifth embodiment of the present invention.

FIG. 9 is a circuit diagram showing a fifth embodiment of the present invention. In the figure, the same reference numerals as those in FIG. 13 designate the same or corresponding elements. Reference numeral 11 designates a capacitance C1 one end of which is connected to the cathode terminal of the diode D1, reference numeral 12 designates the resistance R4 one end of which is connected to the capacitance C1 and the other end of which is connected to the drain terminal of the FET Q1.

Next, a description is given of the operation. In the fourth embodiment, since the values of the load resistances R2 and R3 are different, a difference arises between the drain bias voltages of the switching FETs Q1 and Q2. In this embodiment 5, however, since the resistance R4 is not effective with respect to DC bias, the load resistances of the FETs become R1=R2, and a difference in the drain bias voltages does not arise. However, since at above a certain frequency the impedance $Z_C$ of the capacitance C1 becomes $(2\pi fC)^{-1} \div 0$ and the load of the FET Q1 is represented by the parallel circuit of the resistances R1 and R4, that is, $R_p = (R1^{-1} + R4^{-1})^{-1}$, when the value of the resistance R4 is such that $I1 \cdot Rp = I2 \cdot R2$ for the current amplitudes I1 and I2, an output signal having an equal amplitude for the two phases can be obtained.

Figure 10:
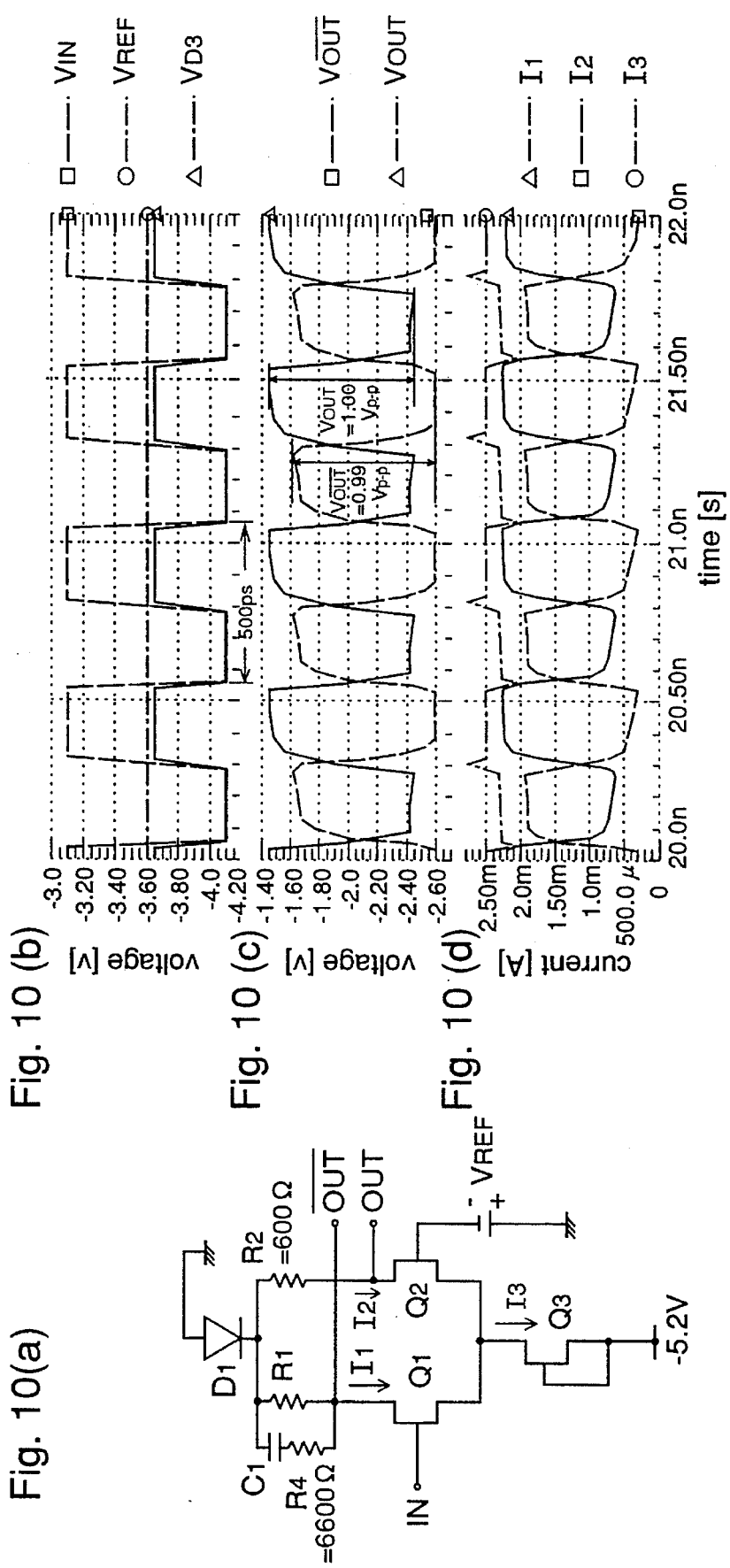
FIGS. 10(a), 10(b), 10(c) and 10(d) are diagrams illustrating a voltage waveform and a current waveform at respective terminals in a differential amplifier having a single phase input and two phase output according to the fifth embodiment shown in FIG. 9.

FIGS. 10(b)–10(d) show the timing waveforms for the voltages at respective terminals and the currents flowing through the respective FETs in the differential amplifier shown in FIG. 9 which is also illustrated in FIG. 10(a) with parameters of respective elements. Reference characters and various lines in the respective graphs, the values of the input voltage and the respective voltage sources, and the input signal period are the same as those in FIGS. 14(b) to 14(d). In the figure, capacitance C1 is 10 pF, and the resistance R4 is 6600 Ω. The output amplitudes become equal, i.e., $V_{OUT}$= 1.00 $V_{p-p}$ and $V_{\overline{OUT}}$=0.99 $V_{p-p}$, since the parallel circuit resistance $R_p$=$(600^{-1}+6610^{-1})^{-1}$÷550 Ω.

As described above, in this embodiment, the load resistance of the input side switching FET Q1 comprises a parallel circuit comprising a resistor having a predetermined resistance value and a serial circuit for adjusting the load resistance comprising a capacitance and a resistance, and the load of the reference side switching FET Q2 comprises a resistor having a predetermined resistance value, whereby stable and equal output voltage amplitudes which are equal for DC and have different values of the load for AC signals can be obtained.

Embodiment 6

Figure 11:
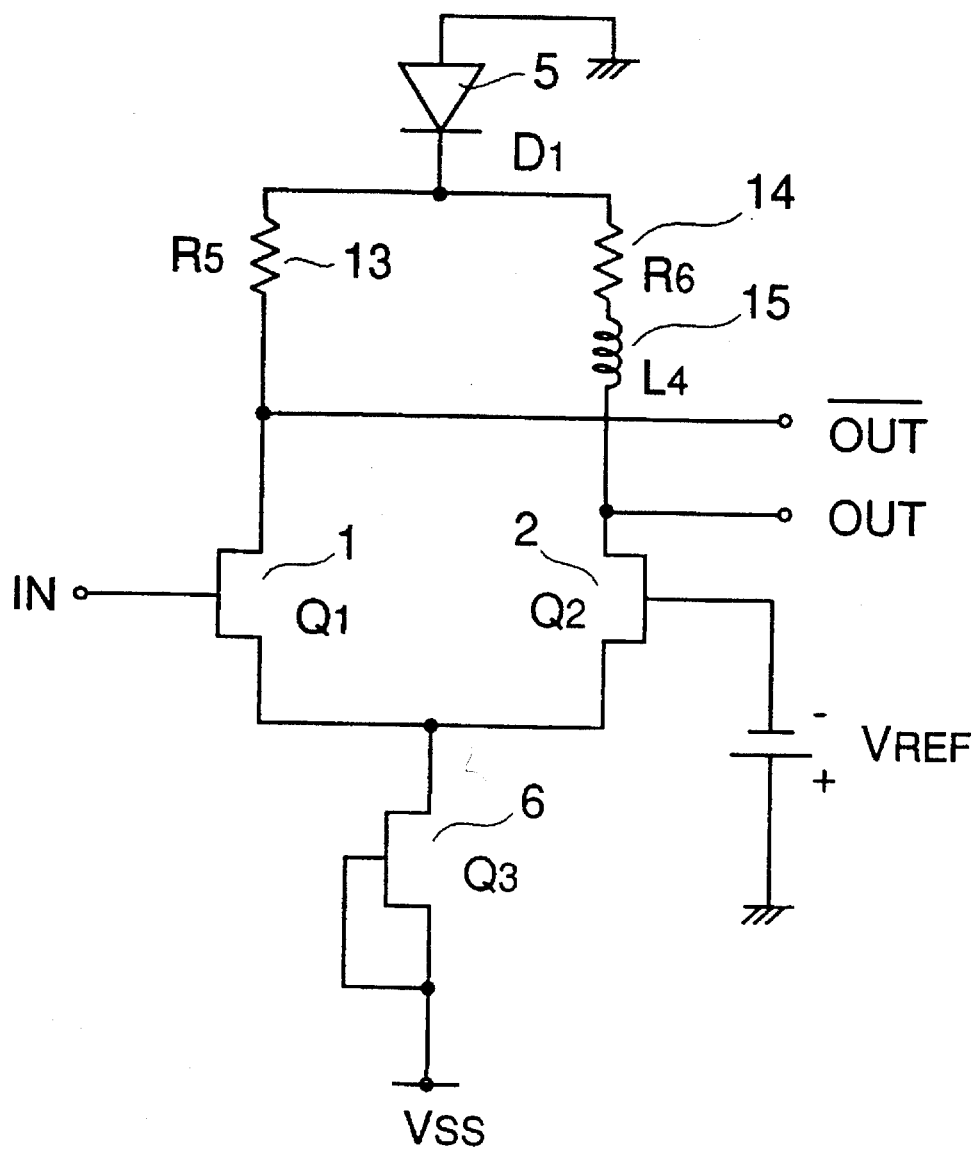
FIG. 11 is a circuit diagram illustrating a differential amplifier having a single phase input and two phase output according to a sixth embodiment of the present invention.

FIG. 11 is a circuit diagram showing a sixth embodiment of the present invention. In the figure, the same reference numerals as those in FIG. 13 designate the same or corresponding elements. Reference numeral 13 designates a load resistance R5 one end of which is connected to the cathode terminal of the diode D1, and the other end of which is connected to the drain terminal of the FET Q1. Reference numeral 14 designates a load resistance R6 connected between the cathode terminal of the diode D1 and the inductor L4, the other end of the inductor L4 being connected to the drain terminal of the reference side FET Q2. Reference numeral 15 designates an inductor L4 connected between the load resistance R6 and the drain terminal of the FET Q2.

Next, description is given of the operation. In the embodiment 6, the impedance $Z_L$ of the inductor L4 is 0 for DC bias and is ignored, and R5=R6, whereby a difference does not arise in the drain bias voltage. Above a certain frequency, however, the load resistance of the FET Q2 is represented by (R6+ZL), the value of the inductor L4 is given such that I1·R5=I2·(R6+$Z_L$) for the current amplitudes I1 and I2, whereby the output signals having equal amplitudes for the two phases can be obtained.

Figure 12:
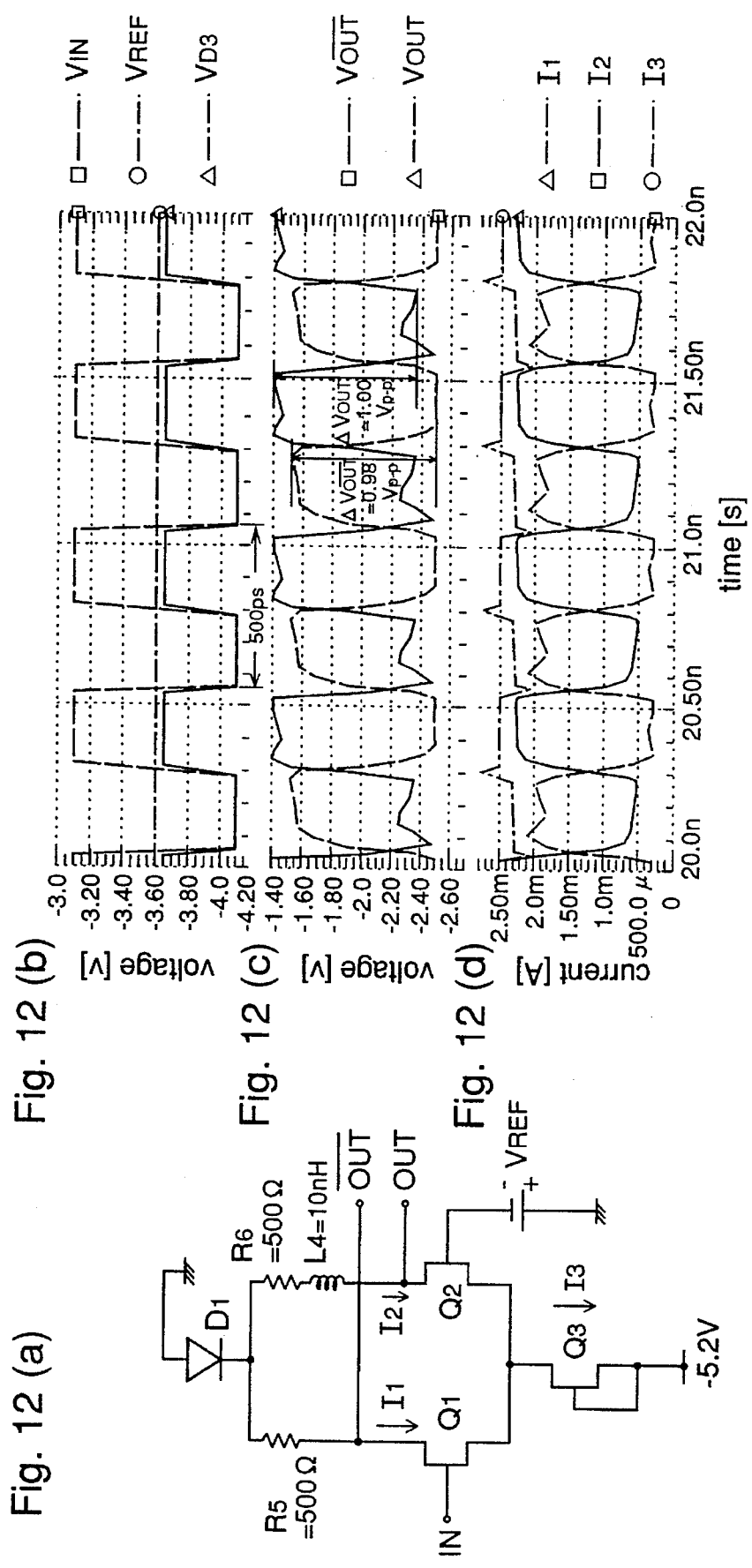
FIGS. 12(a), 12(b), 12(c) and 12(d) are diagrams illustrating a voltage waveform and a current waveform at respective terminals in a differential amplifier having a single phase input and two phase output according to the sixth embodiment shown in FIG. 11.

FIGS. 12(b)–12(d) show the timing waveforms of the voltages at the respective terminals and the currents flowing through the respective FETs in the differential amplifier shown in FIG. 11 which is also illustrated in FIG. 12(a) with parameters of respective elements. In the respective graphs, the reference characters and various lines, the input voltage and the values of the respective current voltage sources, and the input signal period designate the same as those in FIGS. 14(b) to 14(d). In the figure, the resistances R5, R6 are 500 Ω, and the inductor L4 is 10 nH. The resinstance of the RL serial circuit, RS=(500+125)=625 Ω, and the two phase output amplitudes which are approximately equal, i.e., $V_{OUT}$=1.00 $V_{p-p}$, and $V_{\overline{OUT}}$= 0.98 $V_{p-p}$ are obtained.

As described above, in this embodiment, the load of the input side switching FET Q1 comprises a resistor having a predetermined resistance value and the load of the reference side switching FET Q2 comprises an inductor for adjusting the load resistance connected in series to the resistor having a predetermined resistance value, whereby stable and equal output voltage amplitudes which are equal for DC and having different values for AC signals can be obtained.

What is claimed:

1. A differential amplifier having a single phase input and two phase output comprising:

switching field effect transistors provided at an input side and at a reference side, respectively, forming a differential pair;

a field effect transistor serving as a constant current source for providing a current flow equal to a sum of currents flowing through said switching field effect transistors; and an inductor connected in series with said field effect transistor serving as a constant current source between a connection node of respective source electrodes of said switching field effect transistors and a power supply for said amplifier.

2. The differential amplifier of claim 1 wherein said connection node of respective source electrodes of said switching field effect transistors and a first terminal of said field effect transistor serving as a constant current source are directly connected to each other, said field effect transistor serving as a constant current source having a second terminal and a gate electrode connected to each other, wherein said inductor is connected between the second terminal of said field effect transistor serving as a constant current source and the power supply.

3. The differential amplifier of claim 1 wherein a first terminal of said field effect transistor serving as a constant current source is connected to the power supply, said inductor is connected between a second terminal of said field effect transistor serving as a constant current source and said connection node of respective source electrodes of said switching field effect transistors, and the gate electrode of said field effect transistor serving as a constant current source and said first terminal of said field effect transistor serving as a constant current source are connected to each other and to the power supply.

4. The differential amplifier of claim 1 wherein said connection node of respective source electrodes of said switching field effect transistors and a first terminal of said field effect transistor serving as a constant current source are connected to each other, said inductor is connected between a second terminal of said field effect transistor serving as a constant current source and the power supply, and the gate electrode of said field effect transistor serving as a constant current source is connected to the power supply.

5. A differential amplifier having a single phase input and two phase output comprising:

switching field effect transistors provided at an input side and at a reference side, respectively, forming a differential pair;

a field effect transistor serving as a constant current source for providing a current flow equal to a sum of currents flowing through said switching field effect transistors; and respective loads of said switching field effect transistors at the input side and at the reference side, said loads being chosen so that the load is smaller at the input side than at the reference side and respective products of the respective loads and the currents flowing through the respective loads are equal to each other.

6. The differential amplifier of claim 5 wherein said loads of said switching field effect transistors at the input side and at the reference side comprise resistors having different resistances at the input side and at the reference side.

7. The differential amplifier of claim 5 wherein load of said switching field effect transistor at the input side comprises a parallel circuit comprising a resistor having a predetermined resistance and a serial circuit for adjusting the impedance of said load, said serial circuit comprises a capacitance and a resistance, and said load of said reference side switching field effect transistor comprises a resistor having the predetermined resistance.

8. The differential amplifier of claim 5 wherein said load of said switching field effect transistor at the input side comprises a resistor having a predetermined resistance and said load of said switching field effect transistor at the reference side comprises a serial circuit comprising a resistor having the predetermined resistance and an inductor for adjusting the impedance of said load.

* * * * *